(12) United States Patent
Vashchenko et al.

(10) Patent No.: US 6,660,602 B1
(45) Date of Patent: Dec. 9, 2003

(54) STAND-ALONE TRIGGERING STRUCTURE FOR ESD PROTECTION OF HIGH VOLTAGE CMOS

(75) Inventors: Vladislav Vashchenko, Fremont, CA (US); Ann Concannon, San Jose, CA (US); Peter J. Hopper, San Jose, CA (US); Marcel ter Beek, Pleasanton, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 10/097,388

(22) Filed: Mar. 12, 2002

(51) Int. Cl.[7] .............................................. H01L 21/336
(52) U.S. Cl. ...................... 438/301; 438/199; 438/200; 438/303
(58) Field of Search .................................. 438/199, 200, 438/294, 301, 302, 303, 305, 306

(56) References Cited

U.S. PATENT DOCUMENTS 6,465,311 B2 * 10/2002 Shenoy ........................ 438/300

* cited by examiner

*Primary Examiner*—Richard Elms
*Assistant Examiner*—Beth E. Owens
(74) *Attorney, Agent, or Firm*—Vollrath & Associates

(57) ABSTRACT

In a stand-alone snapback NMOS ESD protection structure method of manufacturing, the breakdown voltage is reduced and the structure is made more resilient to hot carrier and soft leakage degradation in the gate region by blocking the NLDD and partially blocking the n+ drain region between the gate and drain region.

10 Claims, 2 Drawing Sheets

STAND-ALONE TRIGGERING STRUCTURE FOR ESD PROTECTION OF HIGH VOLTAGE CMOS

FIELD OF THE INVENTION

The invention relates to a snapback ESD protection structure. In particular it relates to a protection structure for CMOS and BiCMOS ICs used in high voltage applications, such as over-voltage I/O cells and power supplies.

BACKGROUND OF THE INVENTION

In the case of high voltage CMOS and BiCMOS circuits such as I/O cells and power supplies, grounded gate NMOS snapback devices are commonly used for electrostatic discharge (ESD) protection. In fact, in 80% to 90% of CMOS applications, snapback NMOS structures are the protection solution used. It is common to include either separate, stand-alone ESD protection devices for channeling high ESD currents to ground, or to create self-protecting I/O cells in which the same device is used as a high current output driver as well as for ESD protection.

In order to appreciate the respective benefits of self-protection structures as compared to stand-alone protection, it is useful to consider the attributes of NMOS snapback structures. Typically NMOS clamps work adequately during pulsed ESD operation but experience difficulties at continuous excessive currents or very high currents due to limited energy dissipation capability. NMOS snapback structures operate using avalanche multiplication of charge carriers to create conductivity modulation in the on-state. FIG. 1 shows a cross-sectional view that illustrates a conventional NMOS device. As shown in FIG. 1, NMOS 100 has gates 102, 104 formed on a p-type semiconductor material 106. Considering only the NMOS device defined by the gate 104, FIG. 1, further, shows a n-doped drain 110 and n-doped source 112 extending along the sides of the gate 104. In operation, when the voltage across the drain 110 and source 112 is positive but less than the trigger voltage the voltage reverse biases the junction between the p-material under the gate 104 and the n-type material of the drain 110 and source 112. The reverse-biased junction block charge carriers from flowing from drain to source in the absence of appropriate biasing of the gate. However, when the voltage across the drain 110 and source 112 is positive and equal to or greater than the trigger voltage, the reverse-biased junction breaks down due to avalanche multiplication causing holes to be injected into the region beneath the gate 104. The increased number of holes increases the potential of the material beneath the gate 104 and eventually forward biases the junction between the gate and the source, causing the holes to be swept across the junction to be collected by the source 112. Similarly, electrons are swept across from the source to the drain. Some of the electrons injected into the region below the gate 104 recombine with holes and are lost while another part of the holes is lost through the substrate contact. The limited energy dissipation capabilities of NMOS ESD protection clamps can be attributed to the extremely localized region for heat dissipation, which corresponds to approximately a 0.5 $\mu$m region near the gate-drain region.

This becomes even more significant in the case of over-voltage cells that make use of cascoded structures to increase the operating voltage (for example to increase the operating voltage from 3.3 V to 5V.) The double gates of the cascoded structure result in a larger drain-source spacing, as is evident from FIG. 1. When the structure is connected as a set of two cascoded devices with a dual gate, the gates 102 and 104 serve as the gates of the cascoded structure, and the region 120 acts as the source, with the region 110 serving as the drain. However, in such a structure the drain-source spacing between the drain 110 and source 120 is considerably greater. For instance, in a 0.18 $\mu$m CMOS dual gate oxide process, the spacing will be approximately 1.2 $\mu$m. This causes more charge carriers to be lost instead of being swept across the junction. Consequently, a higher electric field is required for avalanche multiplication. The resultant higher electric field E, lattice temperature, and input ionization at the gate 104 exposes the region along the edge of the gate 104 to higher soft gate leakage current degradation and hot carrier degradation.

In the case of high voltage applications such as over-voltage circuits, the use of a stand-alone structure or clamp for channeling current to ground during an ESD event would therefore help avoid the high electric fields and temperatures in the cascoded I/O or power supply structure. However, this exposes the clamp itself to the electric fields and temperatures that the cascoded structure is being protected from. The high potential difference across the source and drain of the NMOS clamp also results in a substantial amount of leakage current which becomes particularly significant in the case of long structures used in high voltage applications.

One solution that could be adopted is to make use of a Thick Field Oxide (TFO) device in which a shallow trench isolation region 200 separates the drain 210 from the source 212, as shown in FIG. 2. However, the shallow trench isolation region 200 is not entirely effective at avoiding leakage current, and, more significantly, displays a high breakdown voltage.

The present invention seeks to provide a stand-alone structure that has both a low breakdown voltage while providing good leakage isolation. Furthermore, the present invention provides a structure that is more robust to the effects of gate soft leakage degradation and hot-carrier degradation of the gate region.

SUMMARY OF THE INVENTION

The present invention provides a new stand-alone NMOS ESD protection structure in which the high junction potential is shifted away from the gate region of the device to separate the electrical stress region with its high electric field, impact ionization, and lattice temperature (which is normally most prevalent at the gate corner) away from the gate region, while still retaining the reduced leakage current provided by the NMOS structure. The gate is preferably grounded or has a low bias voltage to keep the potential drop across the junction between the n+ source and the p-substrate low. The n+ drain to p-substrate junction thus defines a bipolar surface device which provides a low breakdown voltage.

According to the invention there is provided a NMOS structure and a method of creating the NMOS structure in which the n-lightly doped drain (NLDD) and n+ regions of the drain are blocked near the gate to shift the p-n junction away from the gate and create a space between the gate and the drain junction. Preferably the NLDD is fully blocked while the n+ region is partially blocked.

Further, according to the invention, there is provided a method of reducing the breakdown voltage of a NMOS device, comprising at least partially blocking the NLDD and n+ region of the drain. The n+ region preferably defines a sharp surface junction with the p-well or p-substrate material.

Further, according to the invention, there is provided a method of reducing hot carrier degradation in a NMOS device, comprising reducing the potential differences across junctions near the gate by keeping the potential difference across the junction between the n+ source and p-well or substrate low, and by shifting the junction between the n+ drain and the p-well or substrate away from the gate. Preferably the device is a grounded gate NMOS (GGNMOS) device to keep it at the same potential as the grounded well or substrate.

Still further, according to the invention, there is provided a method of reducing the holding voltage of a NMOS device, comprising blocking at least part of the NLDD to leave a drain-substrate junction that is solely between the n+ drain region with its higher injection coefficient and the p-well.

DETAILED DESCRIPTION OF THE INVENTION

Figure 3:
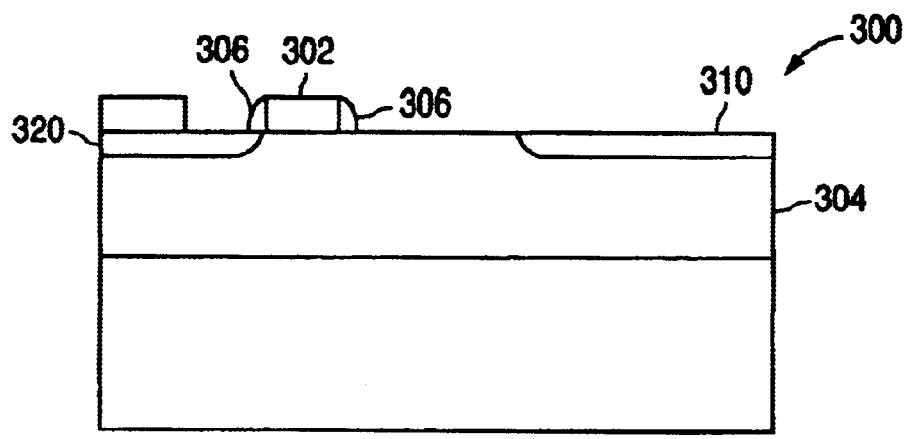
FIG. 3 is a sectional view through one embodiment of a NMOS device of the invention.

FIG. 3 shows one embodiment of a NMOS device of the invention. The device 300 includes a gate 302 formed on a p-substrate or well 304, from which it is separated by a gate oxide (not shown). Nitride spacers 306 extend laterally from the gate 302.

Figure 1:
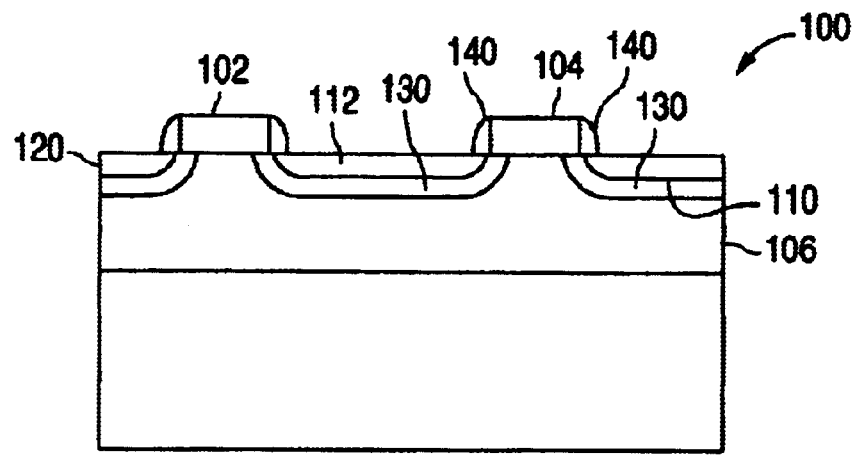
FIG. 1 is a sectional view through a prior art NMOS device.
Figure 2:
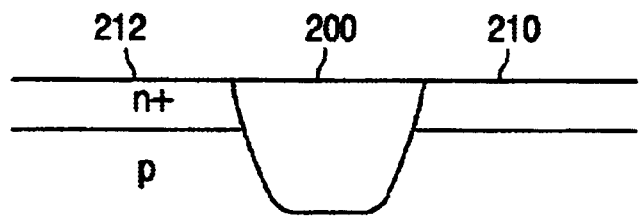
FIG. 2 is a sectional view through a prior art TFO structure.

In a conventional NMOS device, such as the one shown in FIG. 1, the drain 110 and source 112 are formed by first forming lightly doped n-regions 130 on either side of the gate 104 using the gate 104 as a mask. This avoids dopant contamination across the narrow gap under the gate 104 when the high concentration dopants are implanted to form the n+ regions of the drain 110 and source 112. In the conventional device of FIG. 1, the nitride spacers on either side of the gate 104 are used to mask the substrate 106 along the sides of the gate 104 during the formation of the n+ regions.

Referring again to the embodiment illustrated in FIG. 3, it will be noted that the lightly doped region (which on the drain side of the gate is commonly referred to as n-lightly doped drain (NLDD)) has been eliminated entirely and the n+ region 310 is spaced from the gate 302. This is achieved during processing by eliminating the step of creating a lightly doped region. It will be appreciated that since the n+ region on the drain side is now spaced some distance from the gate 302, the concern for contamination under the gate is eliminated, making it unnecessary to first form the lightly doped region. In another embodiment, the lightly doped region could still be formed on the source side of the gate 302. In such an embodiment, a blocking mask would be used to prevent dopant implantation on the drain side of the gate when the lightly doped region is created.

Figure 4:
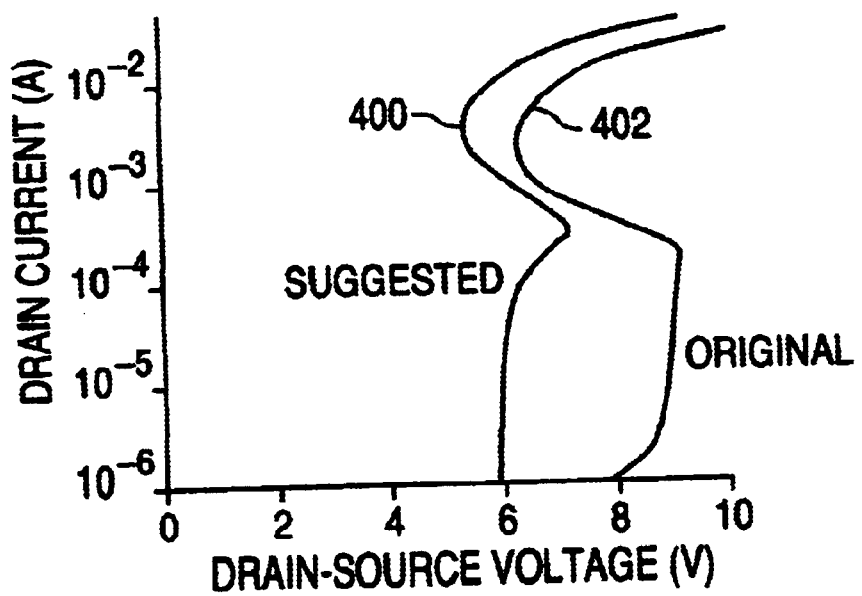
FIG. 4 shows drain current to drain-source voltage curves.

In order to space the n+ region from the gate 302, a blocking mask is used during high dopant implantation, thereby leaving a space or gap between the gate 302 and n+ drain region 310. A space of 0.5–1.3 $\mu$m has been found to work well. The effect of blocking off part of the n+ drain region 310 is to create a sharp lateral bipolar surface between the n+ region and the p-well or substrate 304. This has the effect of lowering the breakdown voltage of the device 300. This reduced breakdown voltage is illustrated in the curves of FIG. 4, which shows the drain current against drain-source voltage for a device of the invention (curve 400) compared to the curve 402 for a conventional device in which the n+ drain region 310 is not shifted. For the device of the invention, the breakdown voltage is approximately 7 V while the breakdown voltage for the original, un-shifted device is approximately 9 V. Curve 400 also shows that the holding voltage of the device of the invention is reduced. This is due to the higher injection coefficient of the n+ drain region 302 without the NLDD.

Furthermore, the blocking of the n+ region of the drain 310 to create the space, has the effect of shifting the bipolar junction between the n+ region and the p-well or substrate 304, away from the gate 302. Thus, it effectively shifts the high potential difference across the junction away from the gate edge thereby reducing hot carrier and soft leakage degradation of the device 300 and reducing the lattice temperature at the edge of the gate 302. Only the bipolar junction between the n+ region of the source 320 and the p-well or substrate remains near the gate. However, by grounding the gate and using the gate as a grounded gate NMOS (GGNMOS), and grounding the substrate, the potential difference between the gate 302 and an n+ region of the source is eliminated. It has been found that the gate can even be slightly biased to provide some control over the device 300, provided the potential difference across this junction near the gate 302 remains low.

Figure 5:
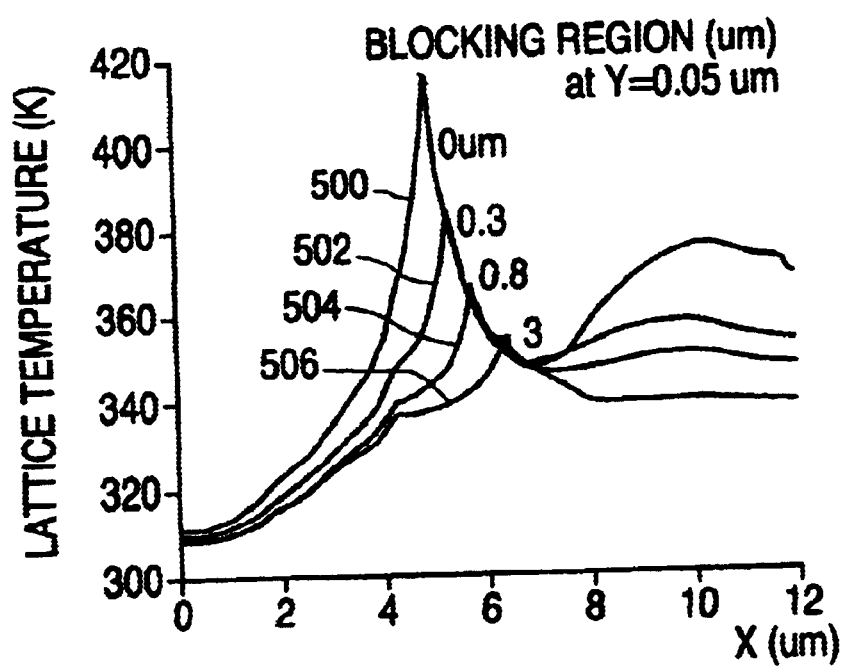
FIG. 5 shows lattice temperature distribution curves for various length blocking regions.

The effect that the shifting the n+ drain region 310 has on the lattice temperature can be seen in the curves shown in FIG. 5. Curve 500 shows the lattice temperature across the width of a conventional device at a depth of 0.05 $\mu$m. Curves 502, 504, 506, in turn, show the lattice temperatures for various embodiments of the invention at the same depth of 0.05 $\mu$m, for spaces between the n+ drain region 310 and the closest edge of the gate 302, of 0.3 $\mu$m, 0.8 $\mu$m, and 1.3 $\mu$m, respectively. It is clear from the curves that the lattice temperature along the edge of the gate closest to the drain drops with increasing space size.

While the invention has been described with reference to a few specific embodiments and by describing specific steps in implementing the shift in the n+ drain region, it will be appreciated that embodiments with different size n+ drain regions and only partial elimination of the NLDD can be implemented without departing from the scope of the invention.

What is claimed is:

1. A method of forming a NMOS snapback structure with low breakdown voltage, comprising forming n+ regions of a source and drain without first forming a lightly doped region, wherein a blocking mask is used to space the n+ drain region from an edge of a gate.

2. A method of claim 1, wherein the space between the n+ drain region and the edge of the gate closest to the n+ drain region is between 0.5–1.3 $\mu$m.

3. A method of reducing the breakdown voltage of a NMOS device, comprising at least partially blocking an NLDD and n+ drain region.

4. A method of claim 3, wherein the n+ drain region defines a sharp surface junction with a p-well or p-substrate material of the device.

5. A method of claim 3, wherein the NLDD is blocked entirely to eliminate the NLDD altogether.

6. A method of claim 3, wherein the n+ drain region is blocked to a distance of 0.5–1.3 µm from the edge of the gate that is closest to the drain region.

7. A method of reducing hot carrier degradation in a NMOS device, comprising reducing potential differences across junctions near, a gate by keeping the potential difference across the junction between an n+ source and p-well or p-substrate low, and by shifting the junction between an n+ drain and the p-well or p-substrate away from the gate.

8. A method of claim 7, wherein the p-well or p-substrate is grounded, and the device is a GGNMOS device to keep it at the same potential as the grounded p-well or p-substrate.

9. A method of reducing the holding voltage of a NMOS device, comprising eliminating at least part of an NLDD to create a drain-substrate junction that is solely between an n+ drain region with its higher injection coefficient and a p-well.

10. A method of claim 9, wherein the NLDD is eliminated altogether by blocking the entire NLDD or by not forming a lightly doped region at all.

\* \* \* \* \*